(12) United States Patent
Thomsen

(10) Patent No.: US 8,073,092 B2
(45) Date of Patent: Dec. 6, 2011

(54) AUTOMATIC SYNCHRONIZATION OF AN INTERNAL OSCILLATOR TO AN EXTERNAL FREQUENCY REFERENCE

(75) Inventor: Joseph Alan Thomsen, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 716 days.

(21) Appl. No.: 12/142,163

(22) Filed: Jun. 19, 2008

(65) Prior Publication Data

US 2009/0316847 A1    Dec. 24, 2009

(51) Int. Cl.
*H03D 3/24* (2006.01)
*H04L 7/00* (2006.01)
*H04L 25/00* (2006.01)
*H04L 25/40* (2006.01)

(52) U.S. Cl. ............ 375/373; 375/354; 375/371

(58) Field of Classification Search .......... 375/373
See application file for complete search history.

(56) References Cited

U.S. PATENT DOCUMENTS

| | | | | |
|---|---|---|---|---|
| 5,592,129 A | * | 1/1997 | Fried et al. | 331/111 |
| 6,181,209 B1 | * | 1/2001 | Tsai | 331/1 A |
| 6,265,916 B1 | | 7/2001 | Ono et al. | |
| 6,329,860 B1 | | 12/2001 | Komatsu | |
| 2004/0008060 A1 | | 1/2004 | Watanabe | |

FOREIGN PATENT DOCUMENTS

EP   0 841 754 A2   5/1998

OTHER PUBLICATIONS

PCT International Search Report, PCT/US2009/047339, 14 pages, Oct. 16, 2009.

* cited by examiner

*Primary Examiner* — David C. Payne
*Assistant Examiner* — Erin File
(74) *Attorney, Agent, or Firm* — King & Spalding L.L.P.

(57) ABSTRACT

An internal integrated circuit clock oscillator is automatically synchronized to an external frequency reference by counting the number of periods of the internal clock oscillator (hereinafter "count") that occur within a period of a lower frequency external frequency reference then comparing the count to the reference count. When the reference count is greater than the count, the frequency of the internal clock oscillator is increased. When the reference count is less than the count, the frequency of the internal clock oscillator is decreased. When the reference count and the count are substantially the same, the frequency of the internal clock oscillator is not changed.

14 Claims, 3 Drawing Sheets

US 8,073,092 B2

AUTOMATIC SYNCHRONIZATION OF AN INTERNAL OSCILLATOR TO AN EXTERNAL FREQUENCY REFERENCE

TECHNICAL FIELD

The present disclosure relates to integrated circuit oscillators, and more particularly, to automatic synchronization of an integrated circuit internal oscillator to a frequency reference.

BACKGROUND

Integrated circuit digital logic circuits use clocks for operation thereof. Certain timing functions performed by the logic circuits require that clocks have a precise frequency. Generally, the frequency determining elements of the internal clock oscillator may be calibrated at the factory for a specific operating temperature and voltage. Any deviation of the operating temperature and/or voltage may change the frequency calibration accuracy of the internal clock oscillator.

SUMMARY

Therefore there is a need for maintaining better long term frequency accuracy of an integrated circuit internal clock oscillator over a range of operating temperatures and voltages. A stable and accurate frequency source may be advantageously utilized to improve the internal clock oscillator frequency accuracy over a range of operating temperatures, voltages and time. This is especially advantageous for applications requiring long term stable and accurate timing such as, for example but not limited to, real time clock and calendar (RTCC) applications, etc.

According to the teachings of this disclosure, an internal integrated circuit clock oscillator can be automatically synchronized to an external frequency reference by counting the number of periods of the internal clock oscillator (hereinafter "count") that occur within a period of a lower frequency external frequency reference, then comparing the count to a reference count. When the reference count is greater than the count, the frequency of the internal clock oscillator is increased. When the reference count is less than the count, the frequency of the internal clock oscillator is decreased. When the reference count and the count are substantially the same, the frequency of the internal clock oscillator is not changed. Preferably, the internal clock oscillator is at a much higher frequency than the external frequency reference since frequency calibration of the internal clock oscillator will be more accurate when the count is a larger number.

According to a specific example embodiment of this disclosure, an integrated circuit device having an internal clock oscillator that is synchronized to an external frequency reference comprises: a clock oscillator; a counter having a clock input coupled to the clock oscillator, wherein the counter counts periods of the clock oscillator; a frequency adjustment controller having a count input, a reference count input, an external frequency reference input, a reset output, a frequency increment output (128) and a frequency decrement output; and an oscillator tuning circuit, the oscillator tuning circuit having frequency increase and decrease inputs coupled to the frequency increment and decrement outputs, respectively, of the frequency adjustment controller; the oscillator tuning circuit is coupled to the clock oscillator, wherein the clock oscillator frequency is determined by the oscillator tuning circuit; wherein the frequency adjustment controller compares the count from the counter with a reference count at the reference count input when a reference frequency period is finished, the reference frequency period is from an external frequency reference coupled to the external frequency reference input of the frequency adjustment controller, and the frequency of the clock oscillator is greater than the frequency of the external frequency reference; wherein: if the reference count is greater than the count then the frequency adjustment controller causes the oscillator tuning circuit to increase the clock oscillator frequency, if the reference count is less than the count then the frequency adjustment controller causes the oscillator tuning circuit to decrease the clock oscillator frequency, if the reference count is substantially the same as the count then the frequency adjustment controller does nothing to the oscillator tuning circuit and the clock oscillator frequency remains at substantially the same frequency; and thereafter the frequency adjustment controller resets the counter count.

According to another specific example embodiment of this disclosure, a method for synchronizing a clock oscillator to an external frequency reference comprises the steps of: providing a clock oscillator having a tunable frequency; counting a number of periods of the clock oscillator occurring within a reference frequency period; comparing the counted number of periods of the clock oscillator to a reference count, wherein, if the counted number of periods of the clock oscillator are less than the reference count then increase the tunable frequency of the clock oscillator, if the counted number of periods of the clock oscillator are greater than the reference count then decrease the tunable frequency of the clock oscillator, and if the counted number of periods of the clock oscillator are substantially the same as the reference count then retain the present tunable frequency of the clock oscillator.

BRIEF DESCRIPTION OF THE DRAWINGS

A more complete understanding of the present disclosure thereof may be acquired by referring to the following description taken in conjunction with the accompanying drawings wherein.

Figure 1:
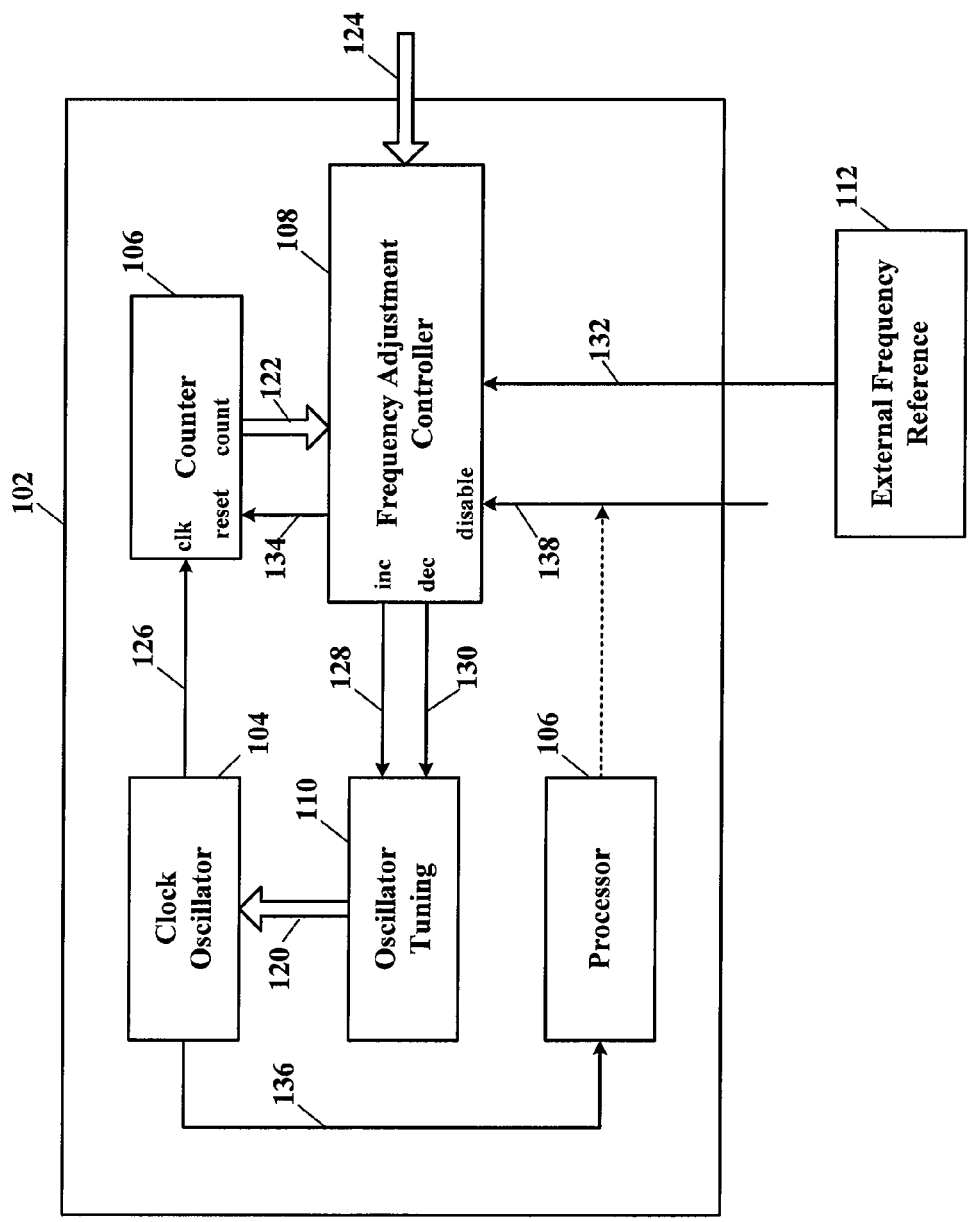
FIG. 1 illustrates a schematic block diagram of an integrated circuit device having an internal clock oscillator that automatically synchronizes its frequency to an external reference frequency, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, details of specific example embodiments are schematically illustrated. Like elements in the drawings will be represented by like numbers, and similar elements will be represented by like numbers with a different lower case letter suffix.

Referring to FIG. 1, depicted is a schematic block diagram of an integrated circuit device having an internal clock oscillator that automatically synchronizes its frequency to an external reference frequency, according to a specific example embodiment of this disclosure. The integrated circuit device, represented by the numeral 102, comprises a clock oscillator 104, a counter 106, a frequency adjustment controller 108, an oscillator tuning circuit 110, and is adapted for coupling to an external frequency reference 112. The integrated circuit device 102 may also comprise a digital processor 114, e.g., microcontroller, microprocessor, digital signal processor (DSP), programmable logic array (PLA), etc.

An output 126 of the clock oscillator 104 is coupled to a clock input of the counter 106. The counter 106 counts each clock pulse from the output 126 until receiving a reset 134 from the frequency adjustment controller 108. The count 122 from the counter 106 is coupled to the frequency adjustment controller 108 and compared to a reference count 124. When the reference count 124 is greater than the count 122, the frequency adjustment controller 108 will send an increment signal 128 to the oscillator tuning circuit 110 which then increases the frequency of the clock oscillator 104. When the reference count 124 is less than the count 122, the frequency adjustment controller 108 will send an decrement signal 130 to the oscillator tuning circuit 110 which then decreases the frequency of the clock oscillator 104. When the reference count 124 and the count 122 are substantially the same, the frequency adjustment controller 108 does nothing to cause the oscillator tuning circuit 110 to change the frequency of the clock oscillator 104.

The external frequency reference 112 may be, for example but limited to, a crystal, a ceramic resonator or any other type of accurate and stable frequency determining device used in combination with an oscillator circuit (not shown) in the frequency adjustment controller 108. The external frequency reference 112 may also be a stable and accurate reference frequency source oscillator (not shown). The reference count 124 may be programmed into the integrated circuit device 102 at the time of manufacture and/or by the processor 106 or other digital device (not shown). When the external frequency reference 112 is not available, the frequency adjustment controller 108 may be disabled with a disable signal 138 from either the processor 106 or an external source (not shown).

As an example, when the oscillator 104 is running at a frequency of 8 MHz and the external frequency reference 112 is providing an accurate and stable signal at a frequency of 32.768 kHz, there will be 244 periods of the signal 126 from the 8 MHz oscillator 104 for each period of the 32.768 kHz signal 132 from the external frequency reference 112. The counter 106 will count the periods of the signal 126 occurring within the one period of the signal 132. The frequency adjustment controller 108 will compare the count 122 from the counter to the reference count 124 (in this example 244) after each period of the signal 132. If the count 122 is substantially the same as the reference count 124, the frequency adjustment controller 108 will do nothing to cause the oscillator tuning 110 to change the frequency of the oscillator 104. However, if the count 122 is less than the reference count 124 the frequency adjustment controller 108 will cause the oscillator tuning 110 to increase the frequency of the oscillator 104. Conversely, if the count 122 is great than the reference count 124 the frequency adjustment controller 108 will cause the oscillator tuning 110 to decrease the frequency of the oscillator 104. This sequence of events occurs each time the period of the signal 132 is completed, then the frequency adjustment controller 108 resets the counter 106 with a reset signal 134. It is contemplated and within the scope of this disclosure that other oscillator 104 and external frequency device 112 frequencies may be utilized with an appropriate reference count 124.

Figure 2:
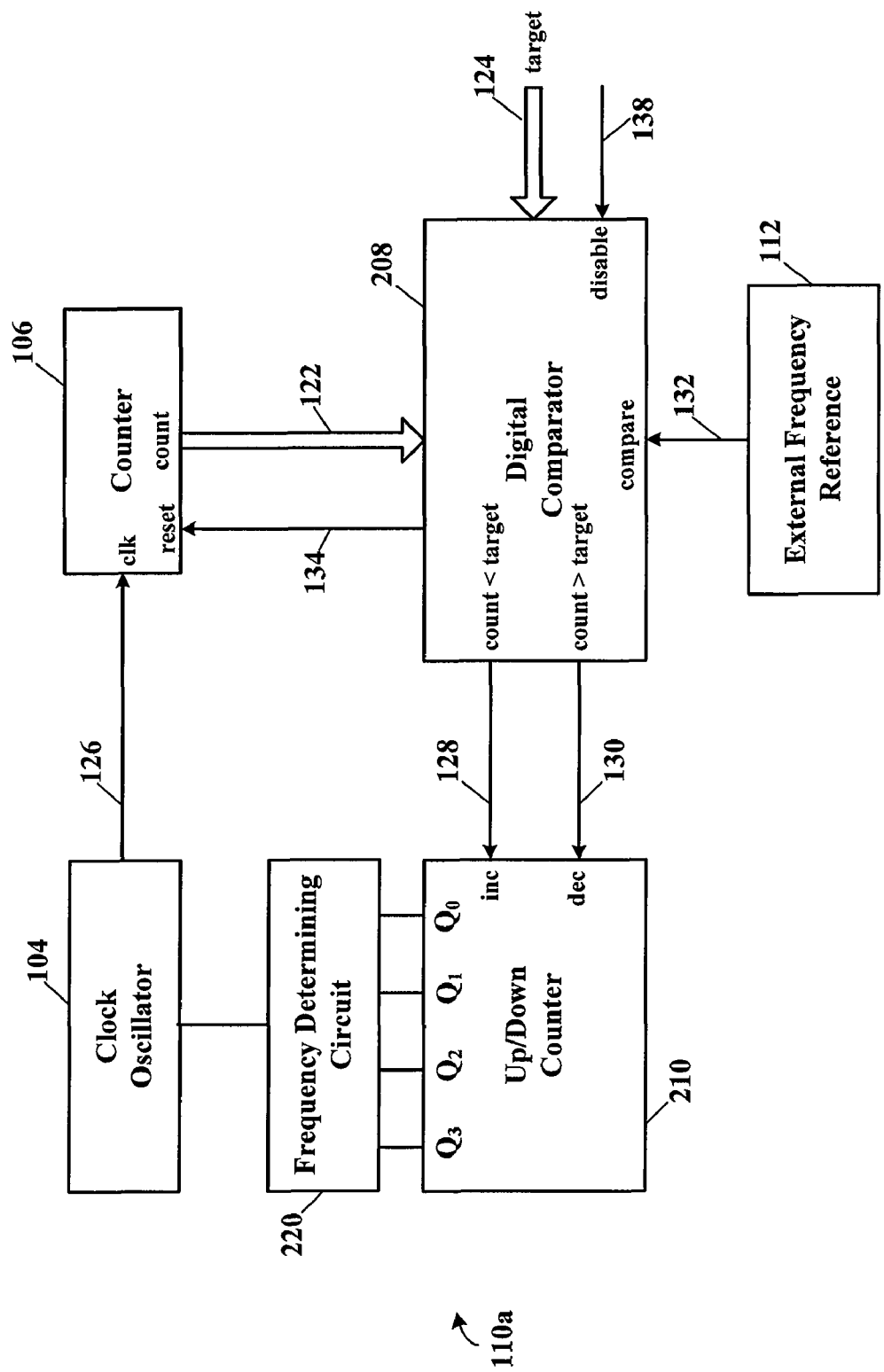
FIG. 2 illustrates a schematic block diagram of a more detailed specific example embodiment of the internal clock oscillator and synchronization circuit shown in FIG. 1.

Referring to FIG. 2, depicted is a schematic block diagram of a more detailed specific example embodiment of the internal clock oscillator and synchronization circuit shown in FIG. 1. The frequency adjustment controller may comprise a digital comparator 208 that compares the count 122 and the reference count 124 as described hereinabove. The oscillator tuning 110 may comprise an up/down counter 210 and a frequency determining circuit 220.

When the count 122 is less than the reference count 124, the digital comparator 208 sends the increment signal 128 to the up/down counter 210, whereby the up/down counter 210 increments its binary outputs $Q_3$-$Q_0$. When the count 122 is greater than the reference count 124, the digital comparator 208 sends the decrement signal 130 to the up/down counter 210, whereby the up/down counter 210 decrements its binary outputs $Q_3$-$Q_0$. When the count 122 is substantially the same as the reference count 124, the digital comparator 208 sends no signal and the up/down counter 210 binary outputs $Q_3$-$Q_0$ do not change.

The frequency determining circuit 220 may be comprised of components such as capacitors (FIG. 3), resistors (not shown), current sources (not shown), etc., or any combination thereof. The tuning component values of the frequency determining circuit 220 are increased and decreased according to the binary outputs $Q_3$-$Q_0$ of the up/down counter 210. Accordingly, the frequency of the oscillator 104 output 126 will change.

Figure 3:
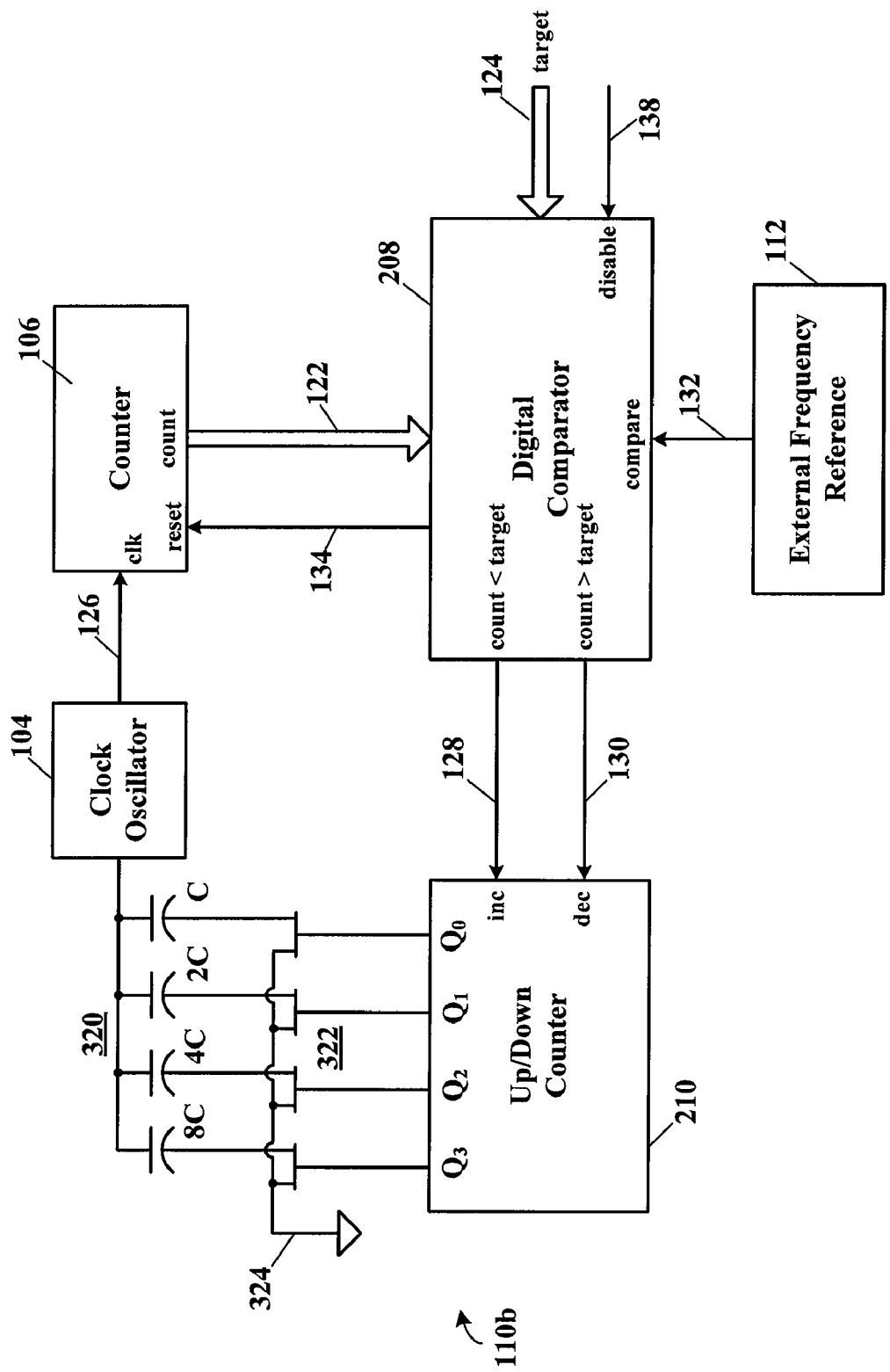
FIG. 3 illustrates a schematic diagram of a specific example embodiment of the frequency determining circuit shown in FIG. 2.

Referring to FIG. 3, depicted is a schematic diagram of a specific example embodiment of the frequency determining circuit shown in FIG. 2. The frequency determining circuit 220 (FIG. 2) may be comprised of a plurality of binary weighted capacitors 320 that may be used to determine the frequency of the clock oscillator 104. Switches (e.g., MOSFET switches) 322 are controlled by the binary outputs $Q_3$-$Q_0$ of the up/down counter 210 and thereby connect and disconnect the plurality of binary weighted capacitors 320 when changing the frequency of the clock oscillator 104. The switches 322 may connect and disconnect the plurality of binary weighted capacitors 320 from a common connection 324 or the switches 322 may connect and disconnect the plurality of binary weighted capacitors 320 from the clock oscillator 104 (this configuration not shown). Resistors and/or current sources may also be utilized in a similar fashion, implementation of which would be known by one having ordinary skill in analog circuit design and having the benefit of this disclosure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art of digital electronics and having the benefit of this disclosure. The depicted and described embodiments of this disclosure are examples only, and are not exhaustive of the scope of the disclosure.

What is claimed is:

1. An integrated circuit device having an internal clock oscillator that is synchronized to an external frequency reference, said integrated circuit device comprising:

a digital processor;
a clock oscillator supplying a clock signal to the digital processor;
a counter having a clock input coupled to the clock oscillator, wherein the counter counts periods of the clock oscillator;
a frequency adjustment controller having a count input, a reference count input, an external frequency reference input, a reset output, a frequency increment output, a frequency decrement output, and a disable input for enabling and disabling operation thereof coupled to the digital processor; and
an oscillator tuning circuit,
the oscillator tuning circuit having frequency increase and decrease inputs coupled to the frequency increment and decrement outputs, respectively, of the frequency adjustment controller;
the oscillator tuning circuit is coupled to the clock oscillator, wherein the clock oscillator frequency is determined by the oscillator tuning circuit;
wherein the frequency adjustment controller compares the count from the counter with a reference count at the reference count input when a reference frequency period is finished, the reference frequency period is from an external frequency reference coupled to the external frequency reference input of the frequency adjustment controller, and the frequency of the clock oscillator is greater than the frequency of the external frequency reference;
wherein:
if the reference count is greater than the count then the frequency adjustment controller causes the oscillator tuning circuit to increase the clock oscillator frequency,
if the reference count is less than the count then the frequency adjustment controller causes the oscillator tuning circuit to decrease the clock oscillator frequency,
if the reference count is substantially the same as the count then the frequency adjustment controller does nothing to the oscillator tuning circuit and the clock oscillator frequency remains at substantially the same frequency; and
thereafter the frequency adjustment controller resets the counter count each time the reference frequency period is finished.

2. The integrated circuit device according to claim 1, wherein the reference count to the frequency adjustment controller is provided by one or more of the group consisting of the digital processor and programming into the integrated circuit device at a time of manufacture.

3. The integrated circuit device according to claim 1, wherein the digital processor is selected from the group consisting of a microcontroller, a microprocessor, a digital signal processor (DSP), and a programmable logic array (PLA).

4. The integrated circuit device according to claim 1, wherein the frequency adjustment controller comprises a digital comparator.

5. The integrated circuit device according to claim 1, wherein the external frequency reference is a crystal.

6. The integrated circuit device according to claim 5, wherein the crystal operates at about 32.768 kHz and the oscillator tuning circuit operates at about 8 MHz.

7. The integrated circuit device according to claim 1, wherein the frequency of the clock oscillator is substantially greater than the frequency of the external frequency reference.

8. A method for synchronizing a clock oscillator to an external frequency reference, said method comprises the steps of:
providing an integrated circuit with a digital processor, a clock oscillator having a tunable frequency and a frequency adjustment controller;
determining whether an external frequency reference is available and if so, enabling the frequency adjustment controller by means of the digital processor;
generating a reference count by the digital processor;
counting a number of periods of the clock oscillator occurring within a reference frequency period provided by the external frequency reference;
comparing the counted number of periods of the clock oscillator to the reference count, wherein,
if the counted number of periods of the clock oscillator are less than the reference count then increase the tunable frequency of the clock oscillator,
if the counted number of periods of the clock oscillator are greater than the reference count then decrease the tunable frequency of the clock oscillator, and
if the counted number of periods of the clock oscillator are substantially the same as the reference count then retain the present tunable frequency of the clock oscillator; and
resetting the counter count each time the reference frequency period is finished.

9. The method according to claim 8, wherein the digital processor is selected from the group consisting of a microcontroller, a microprocessor, a digital signal processor (DSP), and a programmable logic array (PLA).

10. The method according to claim 8, wherein the frequency adjustment controller comprises a digital comparator.

11. The method according to claim 8, wherein the external frequency reference is a crystal.

12. The method according to claim 8, wherein the crystal operates at about 32.768 kHz and the oscillator tuning cicuit operates at about 8 MHz.

13. The method according to claim 8, wherein the frequency of the clock oscillator is substantially greater than the frequency of the external frequency reference.

14. The method according to claim 8, wherein the reference count is programmed into said integrated circuit device at the time of manufacture.

* * * * *